(12) United States Patent
Kang et al.

(10) Patent No.: US 11,812,601 B2
(45) Date of Patent: Nov. 7, 2023

(54) SEMICONDUCTOR DEVICE INCLUDING AN INTERFACE FILM

(71) Applicant: Samsung Electronics Co., Ltd., Suwon-si (KR)

(72) Inventors: Jun Goo Kang, Seoul (KR); Sang Hyuck Ahn, Daegu (KR); Sang Yeol Kang, Yongin-si (KR); Jin-Su Lee, Hwaseong-si (KR); Hyun-Suk Lee, Suwon-si (KR); Gi Hee Cho, Yongin-si (KR); Hong Sik Chae, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 82 days.

(21) Appl. No.: 17/220,411

(22) Filed: Apr. 1, 2021

(65) Prior Publication Data

US 2022/0037325 A1 Feb. 3, 2022

(30) Foreign Application Priority Data

Jul. 30, 2020 (KR) .................. 10-2020-0094944

(51) Int. Cl.
*H10B 12/00* (2023.01)
*H01L 49/02* (2006.01)

(52) U.S. Cl.
CPC ............ *H10B 12/30* (2023.02); *H01L 28/75* (2013.01)

(58) Field of Classification Search
CPC ......... H01L 27/10805; H01L 27/10808; H01L 28/40; H01L 28/56; H01L 28/75; H10B 12/30; H10B 12/31; H10B 12/318
See application file for complete search history.

(56) References Cited

U.S. PATENT DOCUMENTS

| | | | |
|---|---|---|---|
| 8,564,094 B2 | 10/2013 | Hu | |
| 9,773,861 B2 | 9/2017 | Lee et al. | |
| 11,133,317 B2* | 9/2021 | Lee | H01L 21/02129 |
| 11,289,487 B2* | 3/2022 | Rocklein | H01L 28/90 |
| 2008/0272421 A1 | 11/2008 | Bhat | |
| 2014/0327062 A1 | 11/2014 | Park et al. | |
| 2015/0091133 A1 | 4/2015 | Cho et al. | |
| 2015/0221718 A1* | 8/2015 | Rhie | H01L 27/10873 |
| | | | 438/386 |

(Continued)

FOREIGN PATENT DOCUMENTS

| | | | | |
|---|---|---|---|---|
| CN | 208819882 U | * | 5/2019 | ........... H01L 27/108 |
| CN | 110504219 A | | 11/2019 | |
| KR | 20200010913 A | * | 1/2020 | ............. H01L 28/75 |

*Primary Examiner* — Matthew E Warren
(74) *Attorney, Agent, or Firm* — Myers Bigel, P.A.

(57) ABSTRACT

A semiconductor device includes a substrate, first and second supporter patterns stacked sequentially on the substrate in a first direction and spaced apart from an upper surface of the substrate, a lower electrode hole that extends through the first and second supporter patterns on the substrate in the first direction, an interface film on side walls and a bottom surface of the lower electrode hole, a lower electrode inside of the lower electrode hole on the interface film, a capacitor dielectric film that is in physical contact with side walls of the interface film, an uppermost surface of the interface film, and an uppermost surface of the lower electrode, the uppermost surface of the interface film is formed on a same plane as an upper surface of the second supporter pattern.

20 Claims, 24 Drawing Sheets

(56) References Cited

U.S. PATENT DOCUMENTS

| | | |
|---|---|---|
| 2018/0175044 A1 | 6/2018 | Rhie |
| 2019/0165088 A1 | 5/2019 | Cho et al. |
| 2019/0333985 A1* | 10/2019 | Lee .................. H01L 27/10805 |
| 2020/0058731 A1 | 2/2020 | Mun et al. |
| 2021/0111179 A1* | 4/2021 | Shivaraman ...... H01L 27/11507 |
| 2021/0175167 A1* | 6/2021 | Lee .................. H01L 27/11573 |
| 2021/0272959 A1* | 9/2021 | Kim .................. H01L 27/10894 |
| 2022/0028862 A1* | 1/2022 | Yokoyama ........ H01L 27/10852 |

* cited by examiner

SEMICONDUCTOR DEVICE INCLUDING AN INTERFACE FILM

This application claims the benefit of Korean Patent Application No. 10-2020-0094944, filed on Jul. 30, 2020, in the Korean Intellectual Property Office, the disclosure of which is incorporated herein in its entirety by reference.

BACKGROUND

1. Technical Field

The present disclosure relates to a semiconductor device.

2. Description of the Related Art

A buried channel array transistor (BCAT) may overcome a short channel effect of a DRAM structure by including a gate electrode embedded in a trench.

As semiconductor devices become more highly integrated, however, individual circuit patterns may be further miniaturized to implement more semiconductor elements in the same area. That is, design rules of the components of the semiconductor elements may decrease. As DRAM devices have also become more highly integrated, the amount of charge held in a capacitor used in DRAM devices has decreased. Therefore, research for increasing the amount of charge stored in capacitors and improving leakage characteristics of capacitors has been undertaken.

SUMMARY

Aspects of the present inventive concept may provide a semiconductor device that effectively crystallizes a capacitor dielectric film by forming an interface film on a lower electrode.

Aspects of the present inventive concept may also provide a semiconductor device that increases capacitance of a capacitor by forming an interface film between a lower electrode and a capacitor dielectric film to reduce a difference between a maximum value of capacitance and a minimum value of capacitance.

According to an example embodiment of the present inventive concept, there is provided a semiconductor device, comprising a substrate, first and second supporter patterns stacked sequentially on the substrate in a first direction and spaced apart from an upper surface of the substrate, a lower electrode hole that extends through the first and second supporter patterns on the substrate in the first direction, an interface film on side walls and a bottom surface of the lower electrode hole, a lower electrode inside of the lower electrode hole on the interface film, a capacitor dielectric film that is in physical contact with side walls of the interface film, an uppermost surface of the interface film, and an uppermost surface of the lower electrode, the uppermost surface of the interface film is formed on a same plane as an upper surface of the second supporter pattern.

According to an example embodiment of the present inventive concept, there is provided a semiconductor device, comprising a substrate, a lower electrode hole extending in a first direction perpendicular to an upper surface of the substrate on the substrate, an interface film on side walls and a bottom surface of the lower electrode hole, a first lower electrode on the interface film in the lower electrode hole, a second lower electrode inside of the lower electrode hole on the first lower electrode and including a second material different from a first material of the first lower electrode, and a capacitor dielectric film in physical contact with the side walls of the interface film, an uppermost surface of the interface film, and an uppermost surface of the second lower electrode.

According to an example embodiment of the present inventive concept, there is provided a semiconductor device, comprising a substrate, first and second supporter patterns sequentially stacked on the substrate in a first direction and spaced apart from an upper surface of the substrate, a lower electrode hole that extends through the first and second supporter patterns on the substrate in the first direction, an interface film on side walls and a bottom surface of the lower electrode hole, a lower electrode inside of the lower electrode hole on the interface film, an upper electrode between the substrate and the first supporter pattern, between the first supporter pattern and the second supporter pattern, and on an upper surface of the second supporter pattern, and a capacitor dielectric film between the substrate and the upper electrode, between the first supporter pattern and the upper electrode, between the second supporter pattern and the upper electrode, and between the interface film and the upper electrode, wherein the capacitor dielectric film is in physical contact with an uppermost surface of the interface film and an uppermost surface of the lower electrode, the uppermost surface of the interface film is formed on a same plane as the upper surface of the second supporter pattern, and the interface film includes a metal oxide, a metal nitride, or a metal oxynitride.

Embodiments of the present inventive concept are not restricted to the ones set forth in the summary above.

The above and other aspects of the present inventive concept will become more apparent to one of ordinary skill in the art to which the present disclosure pertains by referencing the detailed description of the present inventive concept given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION OF THE EMBODIMENTS

Figure 1:
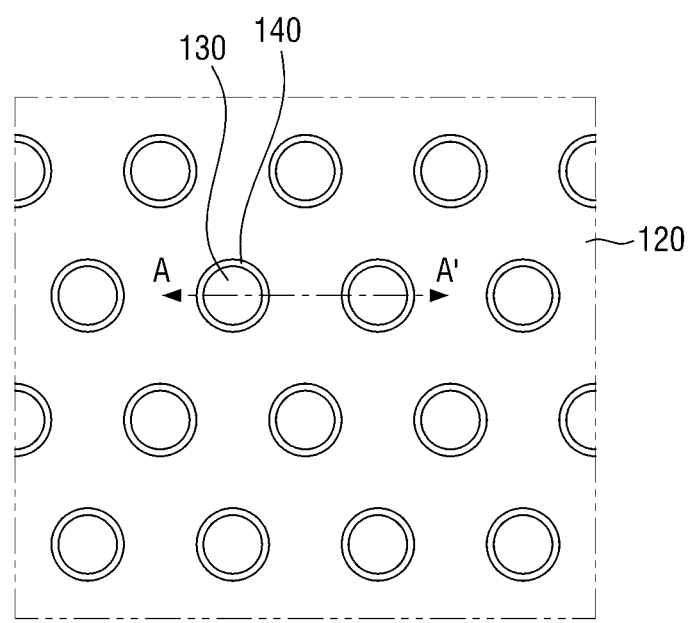
FIG. 1 is a plan view that illustrates a semiconductor device according to some embodiments of the present inventive concept.
Figure 1:
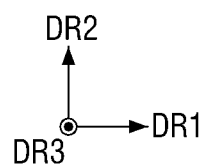

Hereinafter, embodiments of the present disclosure will be described as follows with reference to the accompanying drawings in which example embodiments of the inventive concept are shown. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Hereinafter, a semiconductor device according to some embodiments of the present disclosure will be described referring to FIGS. 1 and 2.

FIG. 1 is a plan view that illustrates a semiconductor device according to some embodiments of the present inventive concept. FIG. 2 is a cross-sectional view taken along a line A-A' of FIG. 1.

Figure 2:
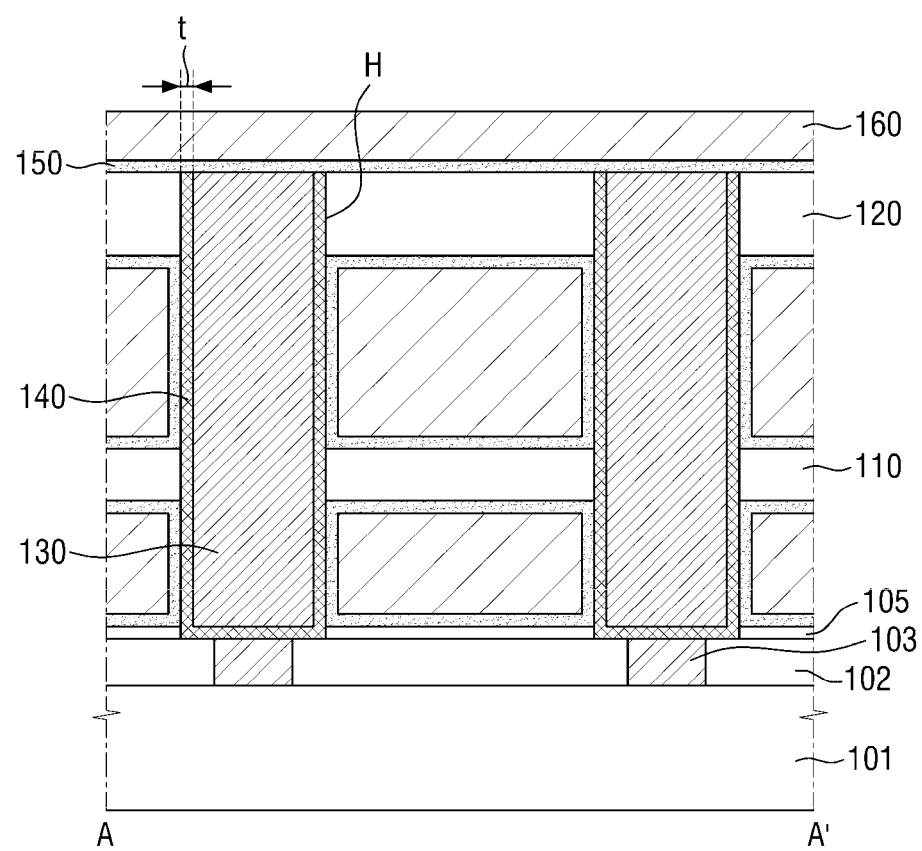
FIG. 2 is a cross-sectional view taken along a line A-A' of FIG. 1.
Figure 2:
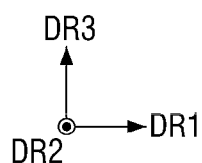

Referring to FIGS. 1 and 2, a semiconductor device according to some embodiments of the present inventive concept comprises a substrate 101, an interlayer insulating film 102, an etching stop film 105, a first supporter pattern 110, a second supporter pattern 120, a lower electrode 130, an interface film 140, a capacitor dielectric film 150 and an upper electrode 160.

The substrate 101 may be bulk silicon or SOI (silicon-on-insulator). In other embodiments, the substrate 101 may be a silicon substrate or may include other materials, for example, but not limited to, silicon germanium, SGOI (silicon germanium on insulator), indium antimonide, lead tellurium compounds, indium arsenide, phosphide indium, gallium arsenide or gallium antimonide. In the following description, the substrate 101 will be described as a silicon substrate.

Although not shown, a gate electrode used as a word line may be disposed inside the substrate 101. A unit active region and an element separation region may be formed on the substrate 101. For example, two transistors may be formed inside a single unit active region.

The interlayer insulating film 102 may be disposed on the substrate 101. The interlayer insulating film 102 may include, for example, silicon oxide ($SiO_2$), silicon nitride (SiN) and/or silicon oxynitride (SiON). The interlayer insulating film 102 may be a single layer or a multilayer.

A contact plug 103 may be disposed in the interlayer insulating film 102 to penetrate or extend through the interlayer insulating film 102 in a vertical direction DR3. The contact plug 103 may be electrically connected to a source/drain region formed inside the substrate 101.

The contact plug 103 may include a conductive material. The contact plug 103 may include, for example, polycrystalline silicon, metal silicide compounds, conductive metal nitride, and/or a metal. However, embodiments of the present inventive concept are not limited thereto.

The etching stop film 105 may be disposed on the interlayer insulating film 102. The etching stop film 105 may be disposed to wrap or border a part of side walls of the interface film 140 formed adjacent to an upper surface of the interlayer insulating film 102.

The etching stop film 105 may include a material having an etching selectivity with respect to a first mold film (181 of FIG. 12) and a second mold film (182 of FIG. 12) including an oxide. The etching stop film 105 may include, for example, silicon nitride (SiN), silicon carbonitride (SiCN), silicon boronitride (SiBN), silicon oxycarbide (SiCO), silicon oxynitride (SiON), silicon oxide (SiO), and/or silicon oxycarbonitride (SiOCN). For example, silicon oxycarbide (SiCO) includes silicon (Si), carbon (C) and oxygen (O), but does not mean to specify a ratio between silicon (Si), carbon (C) and oxygen (O).

The first supporter pattern 110 and the second supporter pattern 120 may be disposed on the substrate 101. The first supporter pattern 110 and the second supporter pattern 120 may be disposed to be sequentially spaced apart from an upper surface of the substrate 101 in the vertical direction DR3.

The first supporter pattern 110 may be disposed on the etching stop film 105 to be spaced apart from the etching stop film 105 in the vertical direction DR3. The second supporter pattern 120 may be disposed on the first supporter pattern 110 to be spaced apart from the first supporter pattern 110 in the vertical direction DR3. Each of the first supporter pattern 110 and the second supporter pattern 120 may be disposed to border or surround the lower electrode 130. That is, each of the first supporter pattern 110 and the second supporter pattern 120 may be disposed between the adjacent lower electrodes 130.

Each of the first supporter pattern 110 and the second supporter pattern 120 may include, for example, silicon oxynitride (SiON), silicon nitride (SiN), silicon carbon nitride (SiCN), and/or tantalum oxide (TaO). Although the first supporter pattern 110 and the second supporter pattern 120 may include the same material, embodiments of the present inventive concept are not limited thereto. In some other embodiments, the first supporter pattern 110 and the second supporter pattern 120 may include materials different from each other.

A lower electrode hole H may penetrate or extend through the first supporter pattern 110 and the second supporter pattern 120 in the vertical direction DR3 on the substrate 101. Further, the lower electrode hole H may penetrate or extend through the etching stop film 105 in the vertical direction DR3. The upper surface of the contact plug 103 may be at least partially exposed or revealed by the lower electrode hole H.

A plurality of lower electrode holes H may be formed to be spaced apart from each other on a horizontal plane comprising a first direction DR1, which is a horizontal direction, and a second direction DR2 perpendicular to the first direction DR1.

The interface film 140 may be disposed along the side walls and a bottom surface of the lower electrode hole H. The interface film 140 may be formed, for example, in a conformal manner. A thickness t of the interface film 140 may be, for example, 10 Å to 50 Å.

An uppermost surface of the interface film 140 may be formed on the same plane in the DR1 direction as an uppermost surface of the second supporter pattern 120. Side walls of the interface film 140 may be in physical contact with each of the first supporter pattern 110 and the second supporter pattern 120. The interface film 140 may be disposed between the first supporter pattern 110 and the lower electrode 130, and between the second supporter pattern 120 and the lower electrode 130, respectively.

The interface film 140 may include a metal oxide, a metal nitride, and/or a metal oxynitride. The interface film 140 may include, for example, niobium titanium nitride (NbTiN), niobium titanium oxide (NbTiO) and/or niobium titanium oxynitride (NbTiON).

The lower electrode 130 may be disposed inside the lower electrode hole H. For example, the lower electrode 130 may completely or partially fill an inside of the lower electrode hole H on the interface film 140. That is, the lower electrode 130 may have a pillar shape. However, embodiments of the present inventive concept are not limited thereto. In some other embodiments, the lower electrode 130 may have a cylinder shape.

The uppermost surface of the lower electrode 130 may be formed on the same plane in the DR1 direction as the uppermost surface of the interface film 140. The uppermost surface of the lower electrode 130 may be formed on the same plane in the DR1 direction as the upper surface of the second supporter pattern 120. The side walls of the lower electrode 130 may not be in physical contact with each of the first supporter pattern 110 and the second supporter pattern 120.

The lower electrode 130 may include a material different from the interface film 140. The lower electrode 130 may include metal nitride. The lower electrode 130 may include, for example, niobium nitride (NbN). In some other embodiments, the lower electrode 130 may include, for example, titanium nitride (TiN), molybdenum nitride (MoN), tantalum nitride (TaN), ruthenium nitride (RuN), tungsten nitride (WN), metal (e.g., ruthenium (Ru), iridium (Ir), titanium (Ti), tantalum (Ta) and/or niobium (Nb)) and/or metal oxides.

The capacitor dielectric film 150 may be disposed on the etching stop film 105, the first supporter pattern 110, the second supporter pattern 120 and the interface film 140 in a conformal manner. Further, the capacitor dielectric film 150 may be disposed on the uppermost surface of the lower electrode 130 as shown in FIG. 2.

Specifically, the capacitor dielectric film 150 may be disposed along the upper surface of the etching stop film 105. The capacitor dielectric film 150 may be disposed along the upper and lower surfaces of the first supporter pattern 110. The capacitor dielectric film 150 may be disposed along the upper and lower surfaces of the second supporter pattern 120. The capacitor dielectric film 150 may be disposed on an end of the side wall of the interface film 140.

The capacitor dielectric film 150 may be in physical contact with each of the side walls of the interface film 140, the uppermost surface of the interface film 140, and the uppermost surface of the lower electrode 130.

The capacitor dielectric film 150 may include silicon oxide ($SiO_2$), silicon nitride (SiN), silicon oxynitride (SiON) and/or a high-dielectric constant material. The high-dielectric constant material may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate. However, embodiments of the present inventive concept are not limited thereto.

The upper electrode 160 may be disposed on the capacitor dielectric film 150. The upper electrode 160 may be further disposed between the substrate 101 and the first supporter pattern 110, between the first supporter pattern 110 and the second supporter pattern 120, and on the upper surface of the second supporter pattern 120.

That is, the capacitor dielectric film 150 may be disposed between the etching stop film 105 and the upper electrode 160, between the interface film 140 and the upper electrode 160, between the first supporter pattern 110 and the upper electrode 160, and between the second supporter pattern 120 and the upper electrode 160. Further, the capacitor dielectric film 150 may be disposed between the uppermost surface of the lower electrode 130 and the upper electrode 160.

The upper electrode 160 may include, for example, doped polysilicon, metal, metal nitride, and/or metal silicide.

The semiconductor device according to some embodiments of the present inventive concept can increase the capacitance of the capacitor by forming an interface film 140 between the lower electrode 130 and the capacitor dielectric film 150 and reducing a difference between the maximum value of capacitance and the minimum value of capacitance.

Further, the semiconductor device according to some embodiments of the present inventive concept can effectively crystallize the capacitor dielectric film 150 by forming the interface film 140 on the lower electrode 130.

Hereinafter, the semiconductor device according to some other embodiments of the present inventive concept will be described referring to FIG. 3. Differences from the semiconductor device shown in FIG. 2 will be the focus of the description.

Figure 3:
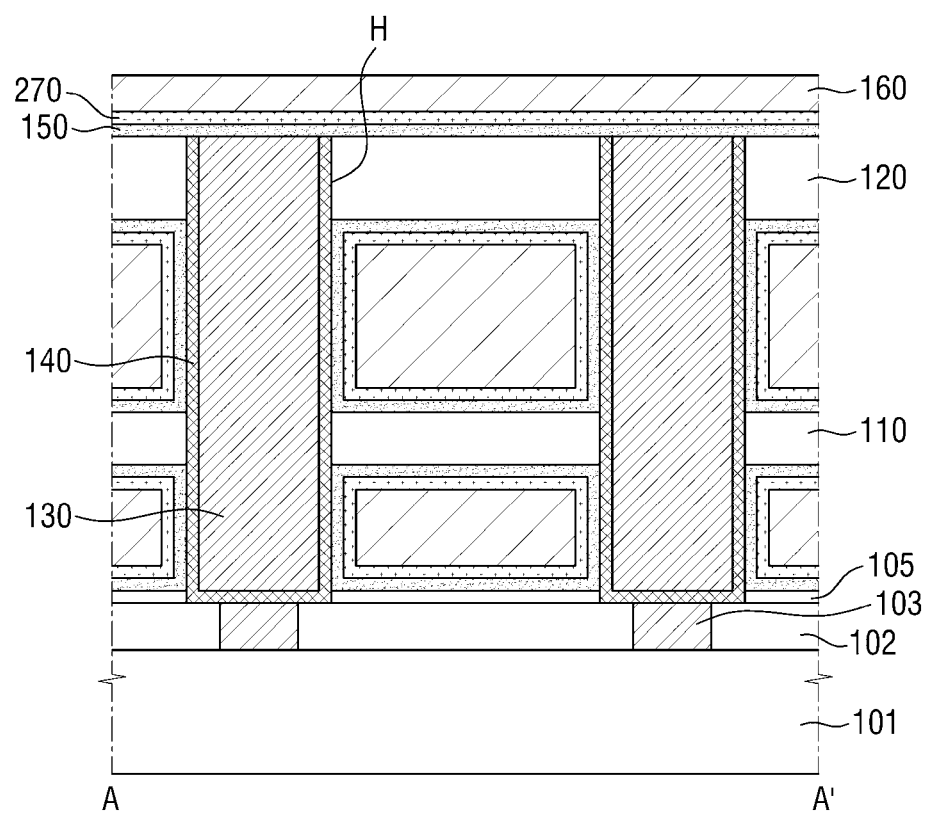
FIG. 3 is a cross-sectional view that illustrates a semiconductor device according to some other embodiments of the present inventive concept.
Figure 3:
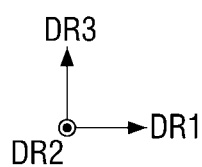

FIG. 3 is a cross-sectional view that illustrates a semiconductor device according to some other embodiments of the present inventive concept.

Referring to FIG. 3, a semiconductor device according to some other embodiments of the present inventive concept may comprise an upper interface film 270 disposed between the capacitor dielectric film 150 and the upper electrode 160.

Specifically, the upper interface film 270 may be disposed between the capacitor dielectric film 150 and the upper electrode 160, between the etching stop film 105 and the first supporter pattern 110. The upper interface film 270 may be disposed between the capacitor dielectric film 150 and the upper electrode 160, between the first supporter pattern 110 and the second supporter pattern 120. The upper interface film 270 may be disposed between the capacitor dielectric film 150 and the upper electrode 160, on the upper surface of the second supporter pattern 120.

The upper interface film 270 may reduce or prevent oxygen atom contained in the capacitor dielectric film 150 from moving to the upper electrode 160. The upper interface film 270 may include metal oxides. The upper interface film 270 may include, for example, titanium oxide, tantalum oxide, molybdenum oxide, tin oxide, and/or niobium oxide.

Hereinafter, a semiconductor device according to some other embodiments of the present inventive concept will be described referring to FIGS. 4 and 5. Differences from the semiconductor device shown in FIG. 2 will be the focus of the description.

Figure 4:
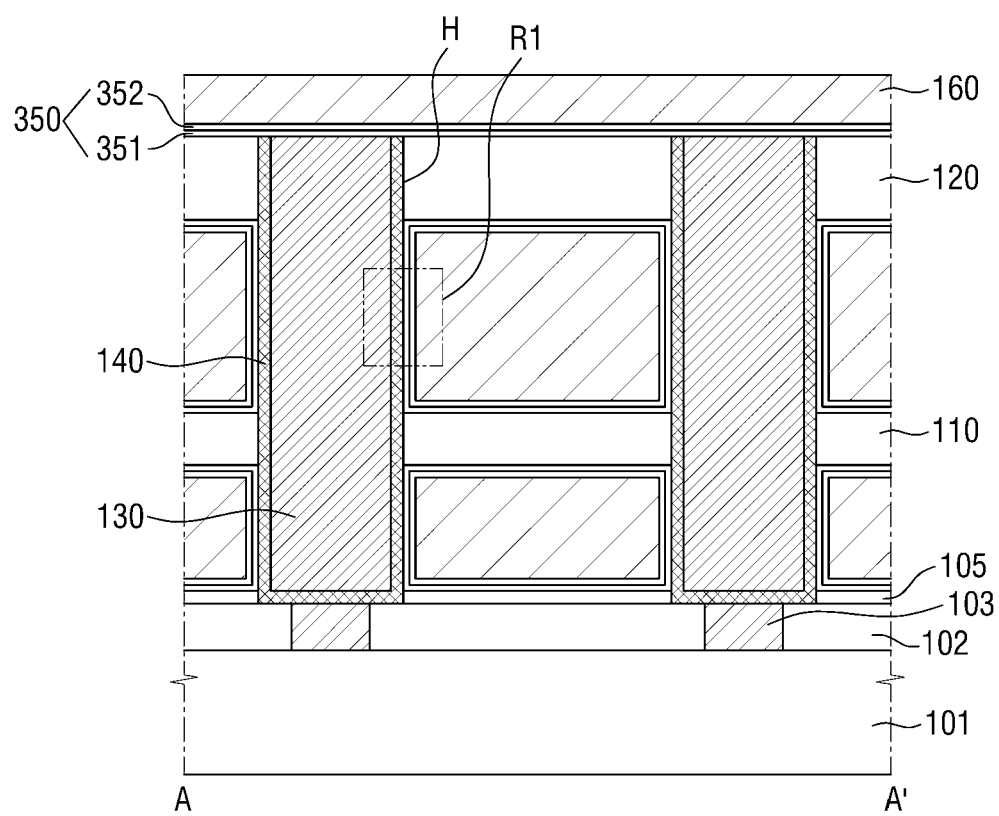
FIG. 4 is a cross-sectional view that illustrates a semiconductor device according to some other embodiments of the present inventive concept.
Figure 4:
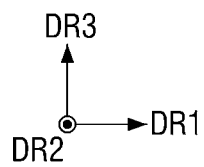

FIG. 4 is a cross-sectional view that illustrates a semiconductor device according to some other embodiments of the present inventive concept. FIG. 5 is an enlarged view of a region R1 of FIG. 4.

Figure 5:
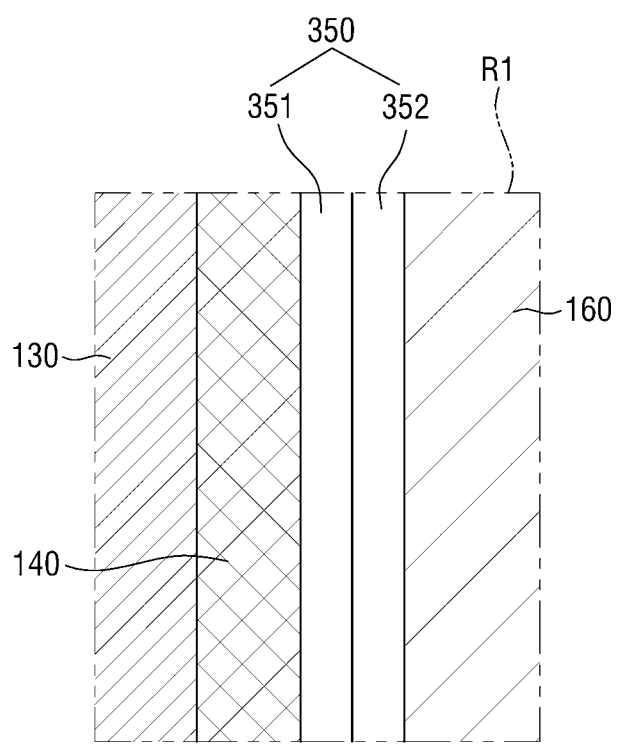
FIG. 5 is an enlarged view of a region R1 of FIG. 4.

Referring to FIGS. 4 and 5, a semiconductor device according to some other embodiments of the present inventive concept may have a capacitor dielectric film 350 formed in a double film.

The capacitor dielectric film 350 may comprise a first capacitor dielectric film 351, and a second capacitor dielectric film 352 disposed on the first capacitor dielectric film 351, such that the dielectric film 350 does not comprise a monolithic layer.

The first capacitor dielectric film 351 may be in physical contact with the side walls and an uppermost surface of the interface film 140. Further, the first capacitor dielectric film 351 may be in physical contact with each of the uppermost surfaces of the etching stop film 105, the first supporter pattern 110, the second supporter pattern 120, and the lower electrode 130. The first capacitor dielectric film 351 may include, for example, hafnium oxide.

The second capacitor dielectric film 352 may be disposed between the first capacitor dielectric film 351 and the upper electrode 160. The second capacitor dielectric film 352 may include a material different from the first capacitor dielectric film 351. The second capacitor dielectric film 352 may include, for example, zirconium oxide.

Hereinafter, a semiconductor device according to some other embodiments of the present inventive concept will be described referring to FIG. 6. Differences from the semiconductor device shown in FIG. 2 will be the focus of the description.

Figure 6:
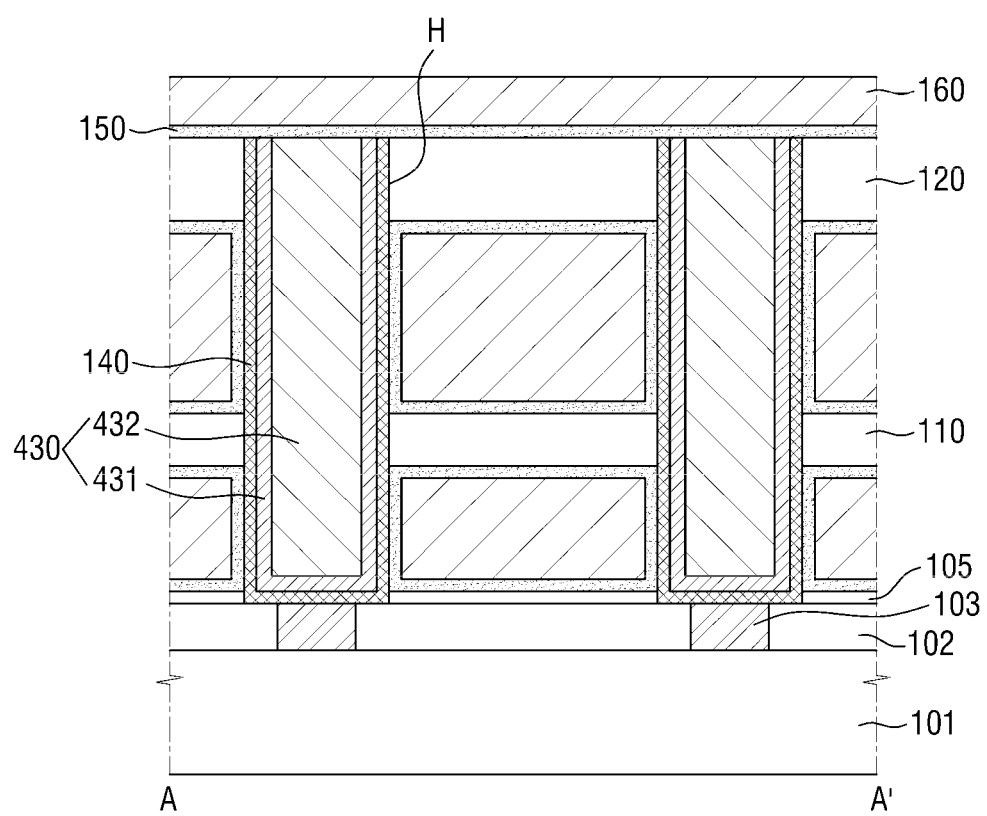
FIG. 6 is a cross-sectional view that illustrates a semiconductor device according to some other embodiments of the present inventive concept.
Figure 6:
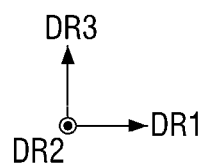

FIG. 6 is a cross-sectional view that illustrates a semiconductor device according to some other embodiments of the present inventive concept.

Referring to FIG. 6, in a semiconductor device according to some other embodiments of the present inventive concept, a lower electrode 430 may comprise a first lower electrode 431 and a second lower electrode 432.

The first lower electrode 431 may be disposed on the interface film 140 inside the lower electrode hole H in a conformal manner. The first lower electrode 431 may include, for example, niobium nitride (NbN).

The second lower electrode 432 may completely or partially fill the inside of the lower electrode hole H on the first lower electrode 431. The second lower electrode 432 may include a material different from the first lower electrode 431. The second lower electrode 432 may include, for example, titanium nitride (TiN).

The uppermost surface of the first lower electrode 431, the uppermost surface of the second lower electrode 432, the uppermost surface of the interface film 140, and the upper surface of the second supporter pattern 120 may be formed on the same plane in the DR1 direction, respectively.

Hereinafter, a semiconductor device according to some other embodiments of the present inventive concept will be described referring to FIG. 7. Differences from the semiconductor device shown in FIG. 2 will be the focus of the description.

Figure 7:
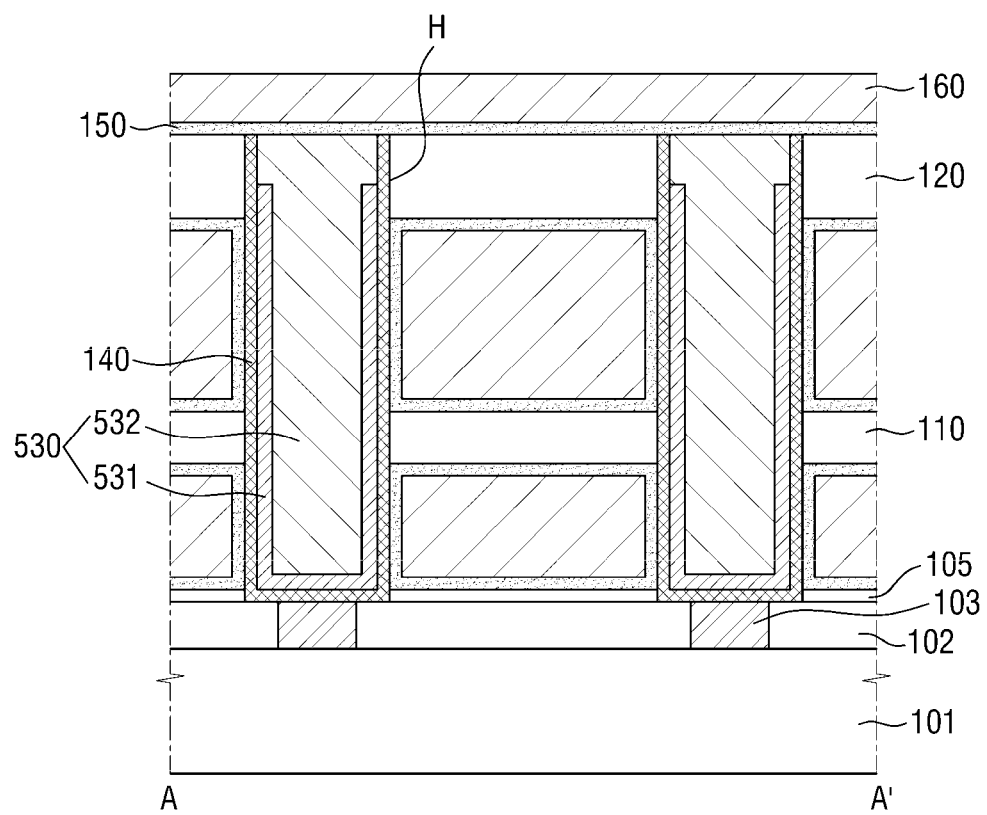
FIG. 7 is a cross-sectional view that illustrates a semiconductor device according to some other embodiments of the present inventive concept.
Figure 7:
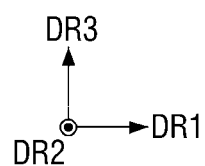

FIG. 7 is a cross-sectional view that illustrates a semiconductor device according to some other embodiments of the present inventive concept.

Referring to FIG. 7, in a semiconductor device according to some other embodiments of the present inventive concept, a lower electrode 530 may comprise a first lower electrode 531 and a second lower electrode 532.

The first lower electrode 531 may be disposed on the interface film 140 inside the lower electrode hole H in a conformal manner. The first lower electrode 531 may not be disposed on at least a part of the upper part of the interface film 140. That is, at least a part of the side walls of the interface film 140 may be at least partially exposed or revealed on the uppermost surface of the first lower electrode 531. The first lower electrode 531 may include, for example, niobium nitride (NbN).

The second lower electrode 532 may completely or partially fill the inside of the lower electrode hole H on the first lower electrode 531. The second lower electrode 532 may be disposed on the uppermost surface of the first lower electrode 531. The second lower electrode 532 may be in physical contact with the uppermost surface of the first lower electrode 531. The second lower electrode 532 may be in physical contact with the interface film 140 on the uppermost surface of the first lower electrode 531. The second lower electrode 532 may include a material different from the first lower electrode 531. The second lower electrode 532 may include, for example, titanium nitride (TiN).

The uppermost surface of the second lower electrode 532, the uppermost surface of the interface film 140, and the upper surface of the second supporter pattern 120 may be formed on the same plane in the DR1 direction, respectively.

Hereinafter, a semiconductor device according to some other embodiments of the present inventive concept will be described referring to FIG. 8. Differences from the semiconductor device shown in FIG. 2 will be the focus of the description.

Figure 8:
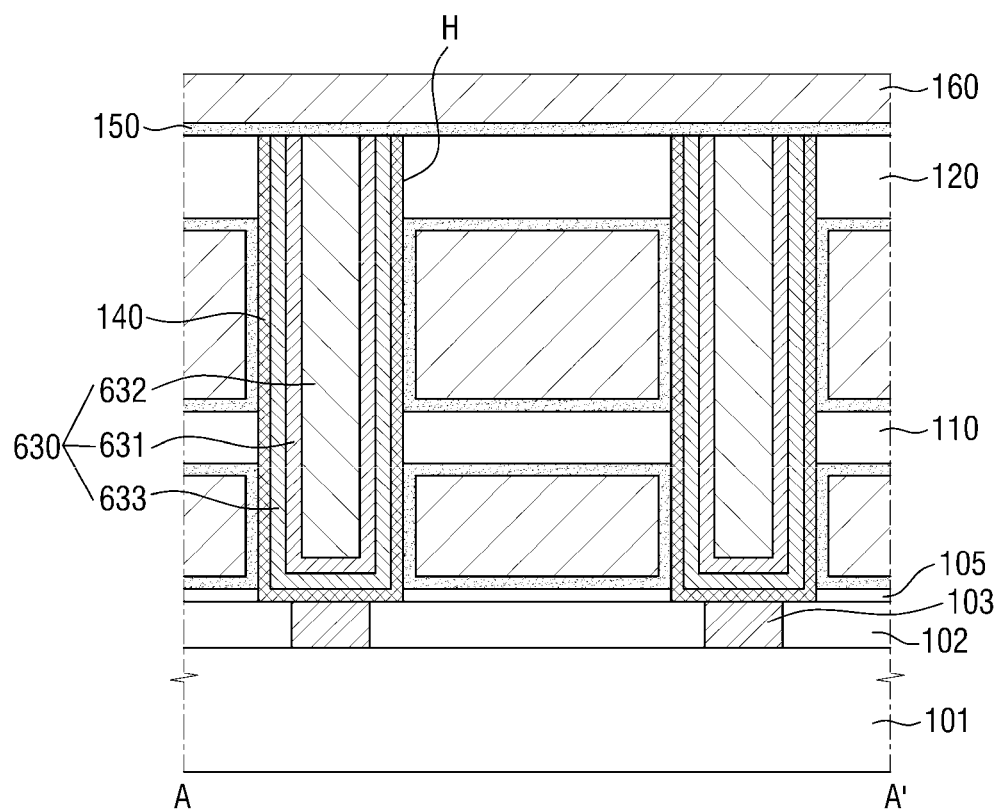
FIG. 8 is a cross-sectional view that illustrates a semiconductor device according to some other embodiments of the present inventive concept.
Figure 8:
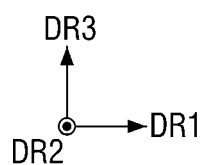

FIG. 8 is a cross-sectional view that illustrates a semiconductor device according to some other embodiments of the present inventive concept.

Referring to FIG. 8, in a semiconductor device according to some other embodiments of the present inventive concept, a lower electrode 630 may comprise a first lower electrode 631, a second lower electrode 632, and a third lower electrode 633.

The first lower electrode 631 may be disposed on the interface film 140 inside the lower electrode hole H in a conformal manner. The first lower electrode 631 may include, for example, titanium nitride (TiN).

The second lower electrode 632 may completely or partially fill the inside of the lower electrode hole H on the first lower electrode 631. The second lower electrode 632 may include a material different from the first lower electrode 631. The second lower electrode 632 may include, for example, niobium nitride (NbN).

The third lower electrode 633 may be disposed between the interface film 140 and the first lower electrode 631 in a conformal manner. The third lower electrode 633 may include a material different from the first lower electrode 631. The third lower electrode 633 may include the same material as the second lower electrode 632. The third lower electrode 633 may include, for example, titanium nitride (TiN). However, embodiments of the present inventive concept are not limited thereto. In some other embodiments, the third lower electrode 633 may include a material different from the second lower electrode 632.

Each of the uppermost surface of the first lower electrode 631, the uppermost surface of the second lower electrode 632, the uppermost surface of the third lower electrode 633, the uppermost surface of the interface film 140 and the upper surface of the second supporter pattern 120 may be formed on the same plane in the DR1 direction.

Hereinafter, a semiconductor device according to some other embodiments of the present inventive concept will be described referring to FIG. 9. Differences from the semiconductor device shown in FIG. 2 will be the focus of the description.

Figure 9:
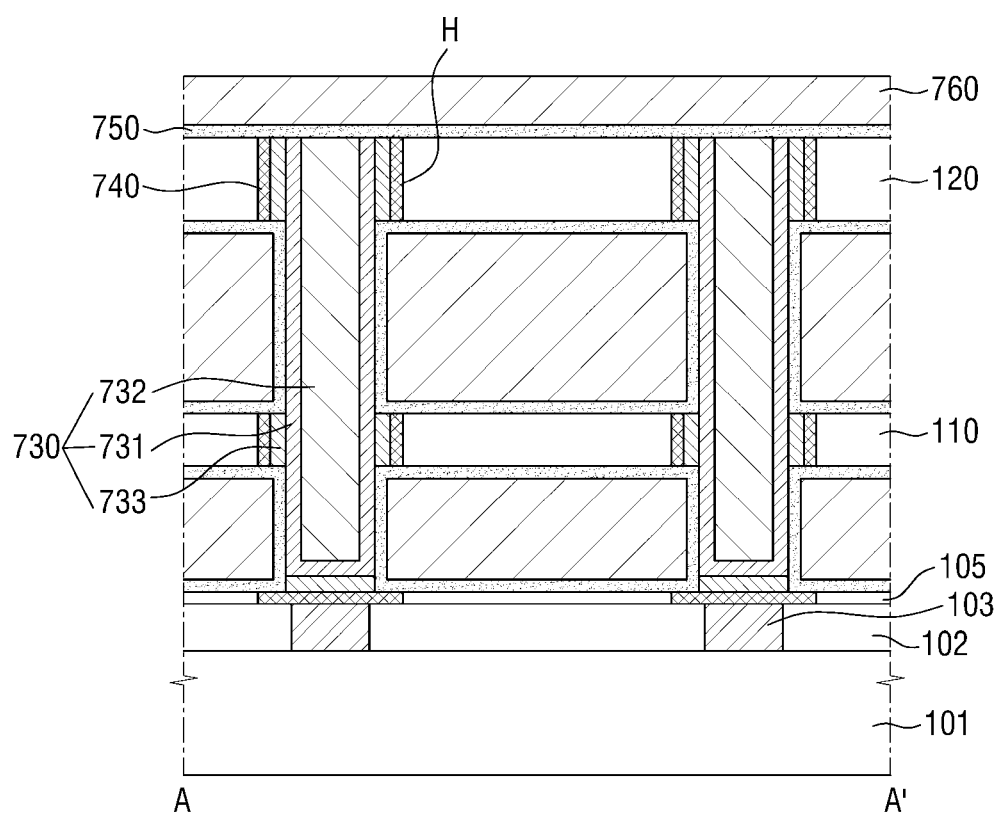
FIG. 9 is a cross-sectional view that illustrates a semiconductor device according to some other embodiments of the present inventive concept.
Figure 9:
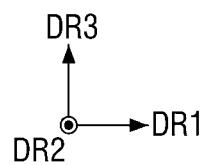

FIG. 9 is a cross-sectional view that illustrates a semiconductor device according to some other embodiments of the present inventive concept.

Referring to FIG. 9, in a semiconductor device according to some other embodiments of the present disclosure, a lower electrode 730 may comprise a first lower electrode 731, a second lower electrode 732, and a third lower electrode 733.

The first lower electrode 731 may be disposed on the interface film 740 inside the lower electrode hole H in a conformal manner. The first lower electrode 731 may include, for example, titanium nitride (TiN).

The second lower electrode 732 may completely or partially fill the inside of the lower electrode hole H on the first lower electrode 731. The second lower electrode 732 may include a material different from the first lower electrode 731. The second lower electrode 732 may include, for example, niobium nitride (NbN).

The third lower electrode 733 may be disposed between the interface film 740 and the first lower electrode 731 in a conformal manner. The third lower electrode 733 may include a material different from the first lower electrode 731. The third lower electrode 733 may include the same material as the second lower electrode 732. The second lower electrode 732 may include, for example, titanium nitride (TiN). However, embodiments of the present inventive concept are not limited thereto. In some other embodiments, the third lower electrode 733 may include a material different from the second lower electrode 732.

Each of the uppermost surface of the first lower electrode 731, the uppermost surface of the second lower electrode 732, the uppermost surface of the third lower electrode 733, the uppermost surface of the interface film 740 and the upper surface of the second supporter pattern 120 may be formed on the same plane in the DR1 direction.

At least a part of the capacitor dielectric film 750 may be in physical contact with the side walls of the first lower electrode 731. Specifically, the capacitor dielectric film 750 may be in physical contact with the side walls of the first lower electrode 731, between the etching stop film 105 and the first supporter pattern 110. The capacitor dielectric film 750 may overlap each of the third lower electrode 733 and the interface film 740, between the etching stop film 105 and the first supporter pattern 110, in the vertical direction DR3.

Further, the capacitor dielectric film 750 may be in physical contact with the side walls of the first lower electrode 731 between the first supporter pattern 110 and the second supporter pattern 120. The capacitor dielectric film 750 may overlap each of the third lower electrode 733 and the interface film 740 between the first supporter pattern 110 and the second supporter pattern 120 in the vertical direction DR3.

The upper electrode 760 may be disposed on the capacitor dielectric film 750.

Hereinafter, a semiconductor device according to some other embodiments of the present inventive concept will be described referring to FIG. 10. Differences from the semiconductor device shown in FIG. 2 will be the focus of the description.

Figure 10:
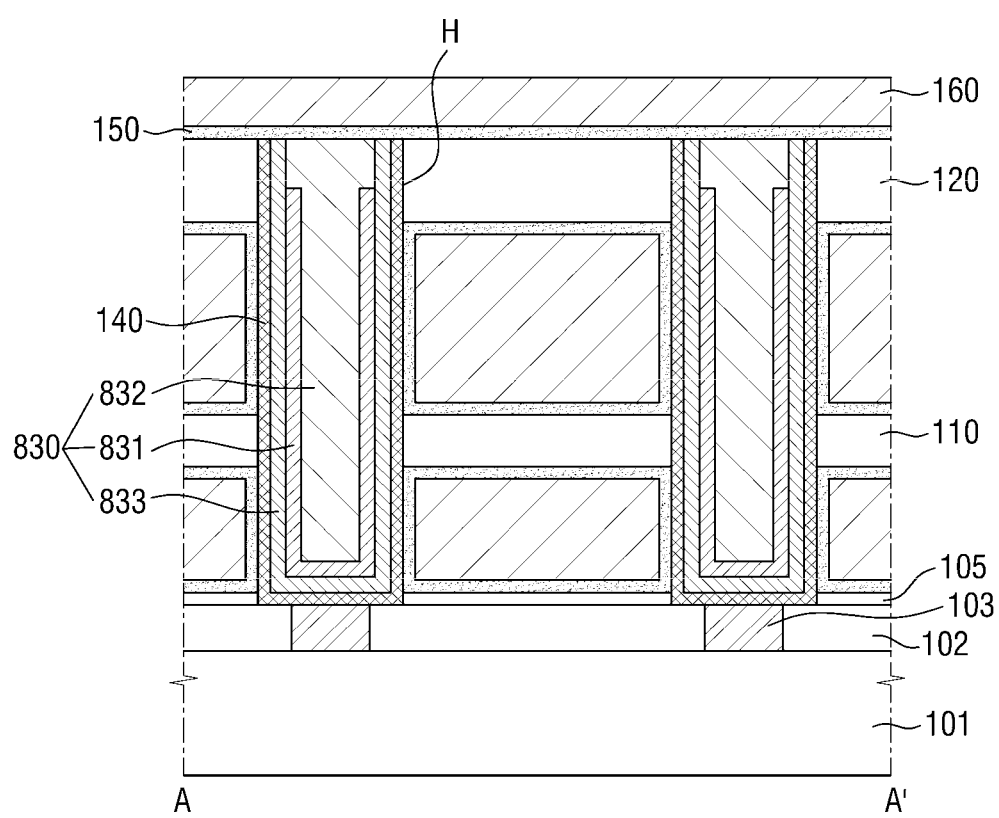
FIG. 10 is a cross-sectional view that illustrates a semiconductor device according to some other embodiments of the present inventive concept.
Figure 10:
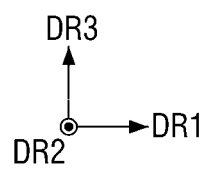

FIG. 10 is a cross-sectional view that illustrates a semiconductor device according to some other embodiments of the present inventive concept.

Referring to FIG. 10, in the semiconductor device according to some other embodiments of the present inventive concept, a lower electrode 830 may comprise a first lower electrode 831, a second lower electrode 832, and a third lower electrode 833.

The third lower electrode 833 may be disposed on the interface film 140 in a conformal manner. The third lower electrode 833 may include a material different from the first lower electrode 831. The third lower electrode 833 may include the same material as the second lower electrode 832. The third lower electrode 833 may include, for example, titanium nitride (TiN). However, embodiments of the present inventive concept are not limited thereto. In some other embodiments, the third lower electrode 833 may include a material different from a second lower electrode 832.

The first lower electrode 831 may be disposed on the third lower electrode 833 inside the lower electrode hole H in a conformal manner. The first lower electrode 831 may not be disposed on at least a part of the upper part of the third lower electrode 833. That is, at least a part of the side walls of the third lower electrode 833 may be at least partially exposed or revealed on the uppermost surface of the first lower electrode 831. The first lower electrode 831 may include, for example, niobium nitride (NbN).

The second lower electrode 832 may completely or partially fill the inside of the lower electrode hole H on the first lower electrode 831. The second lower electrode 832 may be disposed on the uppermost surface of the first lower electrode 831. The second lower electrode 832 may be in physical contact with the uppermost surface of the first lower electrode 831. The second lower electrode 832 may be in physical contact with the third lower electrode 833 on the uppermost surface of the first lower electrode 831. The second lower electrode 832 may include a material different from the first lower electrode 831. The second lower electrode 832 may include, for example, titanium nitride (TiN).

The uppermost surface of the second lower electrode 832, the uppermost surface of the third lower electrode 833, the uppermost surface of the interface film 140, and the upper surface of the second supporter pattern 120 may be formed on the same plane in the DR1 direction, respectively.

Hereinafter, a semiconductor device according to some other embodiments of the present inventive concept will be described referring to FIG. 11. Differences from the semiconductor device shown in FIG. 2 will be the focus of the description.

Figure 11:
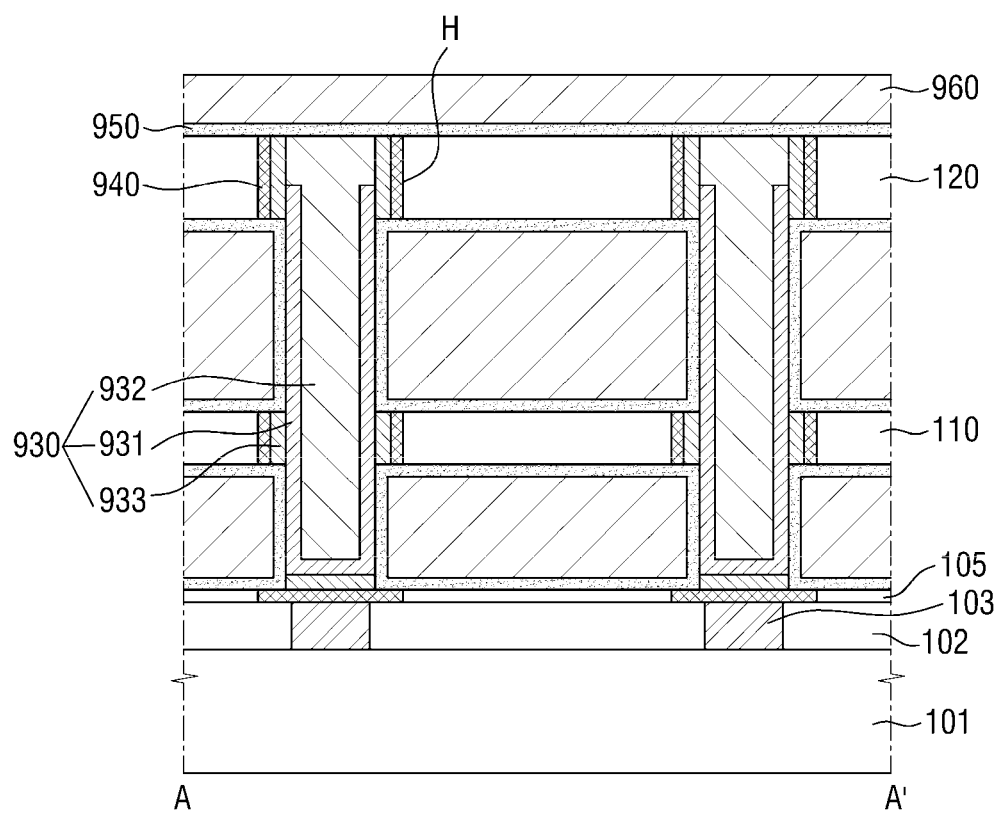
FIG. 11 is a cross-sectional view that illustrates a semiconductor device according to some other embodiments of the present inventive concept.

FIG. 11 is a cross-sectional view that illustrates a semiconductor device according to some other embodiments of the present inventive concept.

Referring to FIG. 11, in a semiconductor device according to some other embodiments of the present inventive concept, a lower electrode 930 may comprise a first lower electrode 931, a second lower electrode 932, and a third lower electrode 933.

The third lower electrode 933 may be disposed on the interface film 940 in a conformal manner. The third lower electrode 933 may include a material different from the first lower electrode 931. The third lower electrode 933 may include the same material as the second lower electrode 932. The third lower electrode 933 may include, for example, titanium nitride (TiN). However, embodiments of the present inventive concept are not limited thereto. In some other embodiments, the third lower electrode 933 may include a material different from the second lower electrode 932.

The first lower electrode 931 may be disposed on the third lower electrode 933 inside the lower electrode hole H in a conformal manner. The first lower electrode 931 may not be disposed on at least a part of the upper part of the third lower electrode 933. That is, at least a part of the side walls of the third lower electrode 933 may be at least partially exposed or revealed on the uppermost surface of the first lower electrode 931. The first lower electrode 931 may include, for example, niobium nitride (NbN).

The second lower electrode 932 may completely or partially fill the inside of the lower electrode hole H on the first lower electrode 931. The second lower electrode 932 may be disposed on the uppermost surface of the first lower electrode 931. The second lower electrode 932 may be in physical contact with the uppermost surface of the first lower electrode 931. The second lower electrode 932 may be in physical contact with the third lower electrode 933 on the uppermost surface of the first lower electrode 931. The second lower electrode 932 may include a material different from the first lower electrode 931. The second lower electrode 932 may include, for example, titanium nitride (TiN).

The uppermost surface of the second lower electrode 932, the uppermost surface of the third lower electrode 933, the uppermost surface of the interface film 940, and the upper surface of the second supporter pattern 120 may be formed on the same plane in the DR1 direction, respectively.

At least a part of the capacitor dielectric film 950 may be in physical contact with the side walls of the first lower electrode 931. Specifically, the capacitor dielectric film 950 may be in contact with the side walls of the first lower electrode 931 between the etching stop film 105 and the first supporter pattern 110. The capacitor dielectric film 950 may overlap each of the third lower electrode 933 and the interface film 940 between the etching stop film 105 and the first supporter pattern 110 in the vertical direction DR3.

Further, the capacitor dielectric film 950 may be in physical contact with the side walls of the first lower electrode 931 between the first supporter pattern 110 and the second supporter pattern 120. The capacitor dielectric film 950 may overlap each of the third lower electrode 933 and the interface film 940 between the first supporter pattern 110 and the second supporter pattern 120 in the vertical direction DR3.

The upper electrode 960 may be disposed on the capacitor dielectric film 950.

Hereinafter, a method for fabricating the semiconductor device shown in FIG. 2, according to some embodiments of the inventive concept, will be described referring to FIGS. 2 and 12 to 21.

FIGS. 12 to 21 are intermediate stage diagrams that illustrate a method for fabricating the semiconductor device shown in FIG. 2 according to some embodiments of the inventive concept.

Figure 12:
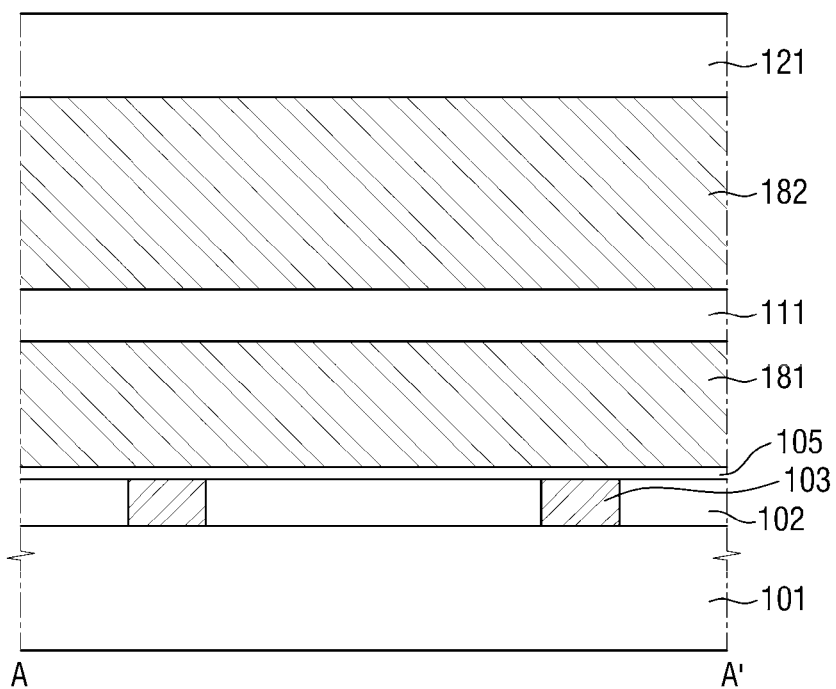
FIGS. 12 to 21 are intermediate stage diagrams that illustrates a method for fabricating the semiconductor device shown in FIG. 2.
Figure 12:
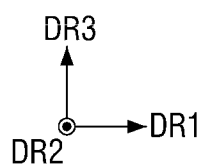

Referring to FIG. 12, an interlayer insulating film 102, and a contact plug 103 penetrating or extending through the interlayer insulating film 102 in the vertical direction DR3 may be formed on the substrate 101.

Subsequently, an etching stop film 105, a first mold film 181, a first supporter film 111, a second mold film 182, and a second supporter film 121 may be sequentially stacked on the interlayer insulating film 102 and the contact plug 103.

Each of the first mold film 181 and the second mold film 182 may include silicon oxide ($SiO_2$). Each of the first mold film 181 and the second mold film 182 may include, for example, FOX (Flowable Oxide), TOSZ (Tonen SilaZen), USG (Undoped Silica Glass), BSG (Borosilica Glass), PSG (PhosphoSilaca Glass), BPSG (BoroPhosphoSilica Glass), PE-TEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD) or a combination thereof.

Although FIG. 12 shows that each of the first mold film 181 and the second mold film 182 is formed as a single monolithic layer, embodiments of the present inventive concept are not limited thereto. That is, in some other embodiments, each of the first mold film 181 and the second mold film 182 may comprise two or more layers with different etching rates from each other.

Figure 13:
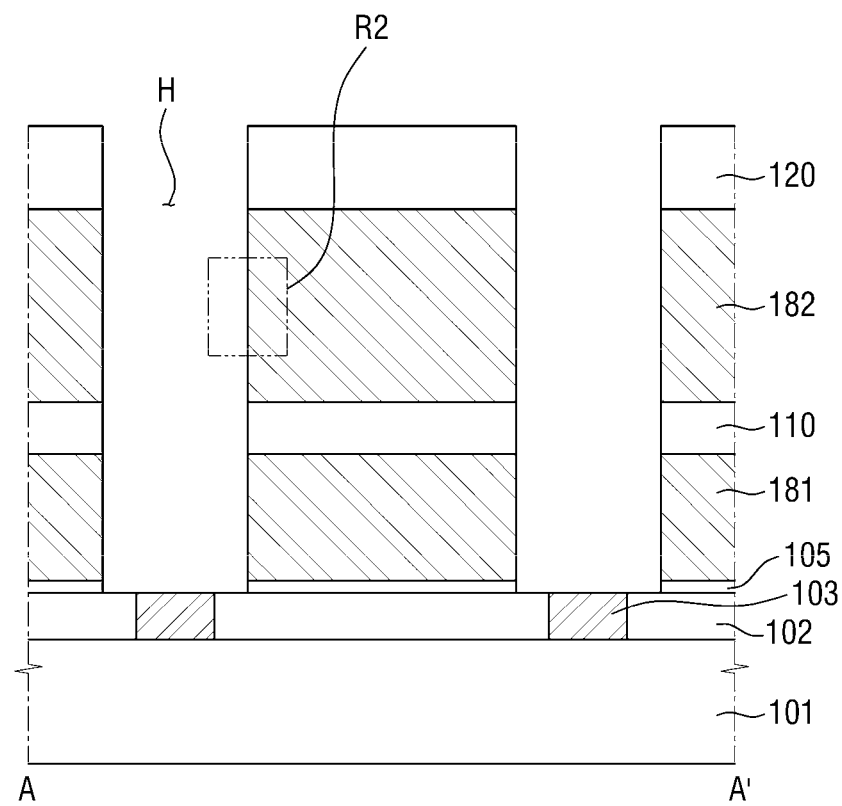

Referring to FIG. 13, a plurality of lower electrode holes H which penetrates or extend through a second supporter film (121 of FIG. 12), a second mold film 182, a first supporter film (111 of FIG. 12), a first mold film 181 and an etching stop film 105 in the vertical direction DR3 may be formed. In this structure, the upper surface of the contact plug 103 may be at least partially exposed or revealed through the lower electrode hole H.

Figure 14:
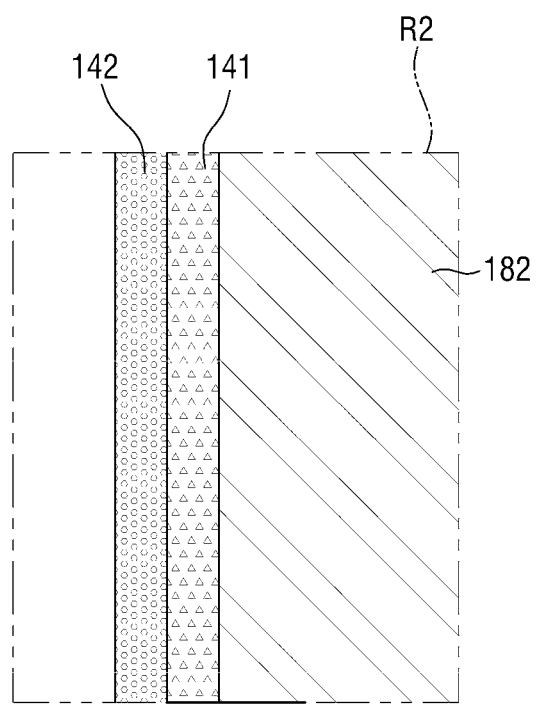
Figure 14:
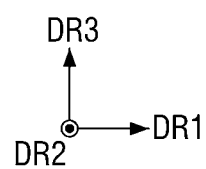

Referring to FIGS. 13 and 14, a first pre interface film 141 and a second pre interface film 142 may be sequentially formed along the side walls and a bottom surface of the lower electrode hole H.

Specifically, the first pre interface film 141 may be formed along the side walls and the bottom surface of the lower electrode hole H in a conformal manner. The first pre interface film 141 may include metal oxides. The first pre interface film 141 may include, for example, niobium oxide (NbO).

Subsequently, the second pre interface film 142 may be formed on the first pre interface film 141 in a conformal manner. The second pre interface film 142 may include metal nitrides. The second pre interface film 142 may include, for example, niobium nitride (NbN).

Figure 15:
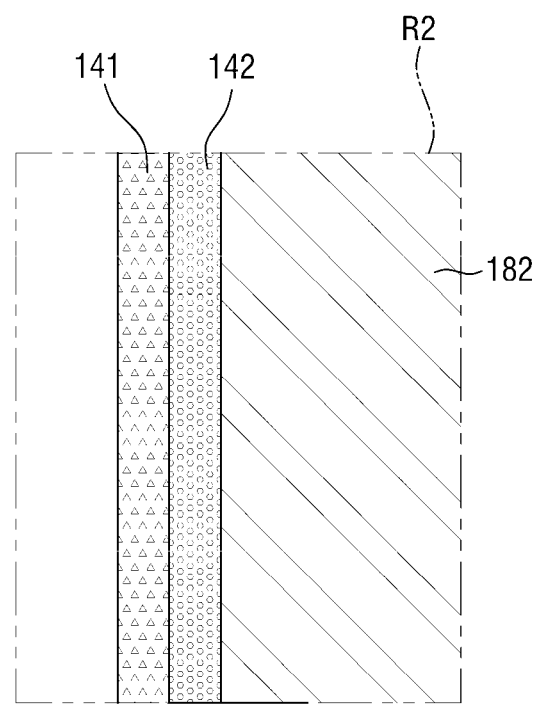

In some other embodiments, as shown in FIG. 15, the second pre interface film 142 and the first pre interface film 141 may be sequentially formed along the side walls and the bottom surface of the lower electrode hole H.

Specifically, the second pre interface film 142 may be formed along the side walls and the bottom surface of the lower electrode hole H in a conformal manner. Subsequently, the first pre interface film 141 may be formed on the second pre interface film 142 in a conformal manner.

Figure 16:
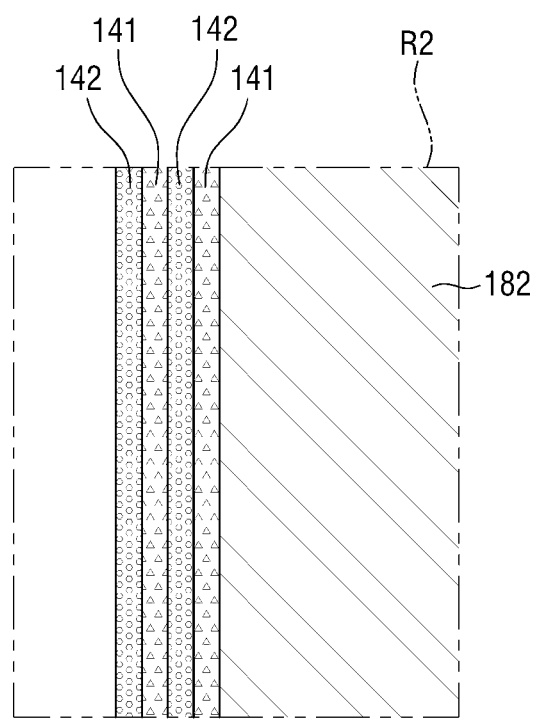

In some other embodiments, as shown in FIG. 16, the first pre interface film 141 and the second pre interface film 142 may be stacked alternately along the side walls and the bottom surface of the lower electrode hole H. That is, the first pre interface film 141, the second pre interface film 142, the first pre interface film 141, and the second pre interface film 142 may be stacked sequentially on the side walls and the bottom surface of the lower electrode hole H.

Figure 17:
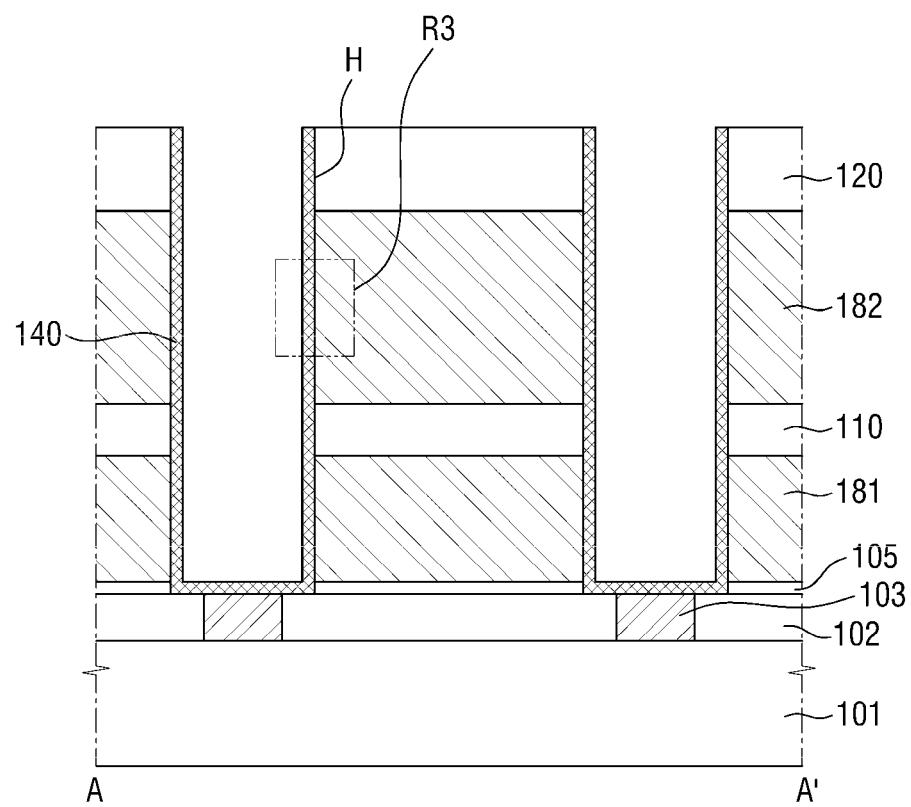
Figure 18:
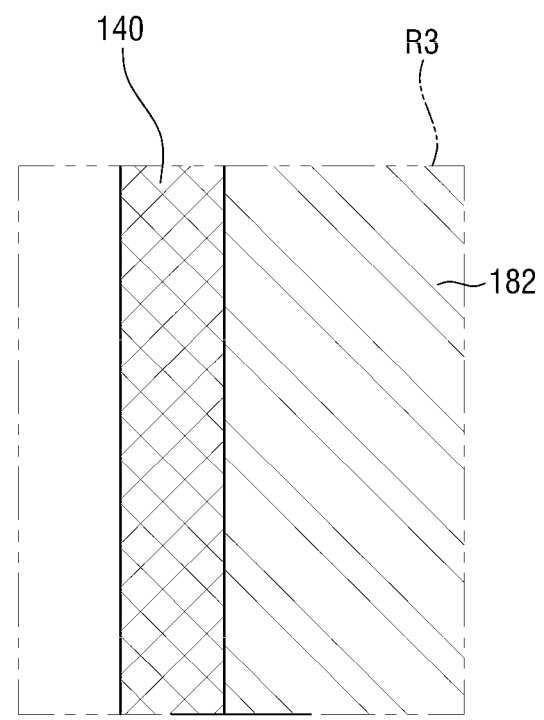

Referring to FIGS. 17 and 18, the interface film 140 may be formed by making the first pre interface film 141 and the second pre interface film 142 react with each other. The interface film 140 may be formed along the side walls and the bottom surface of the lower electrode hole H in a conformal manner.

Figure 19:
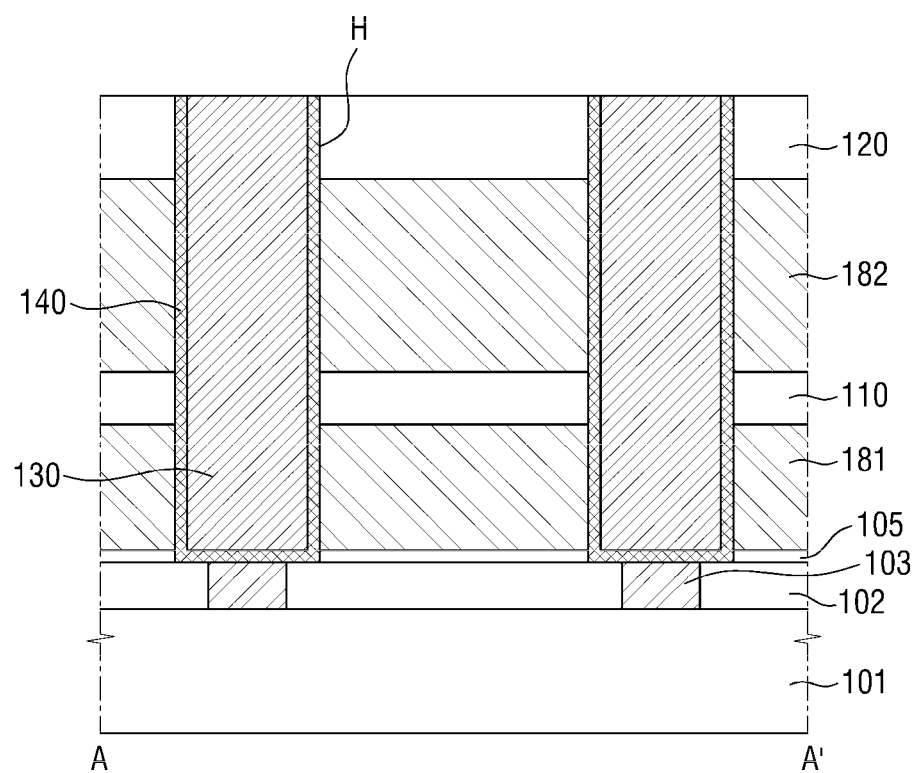
Figure 19:
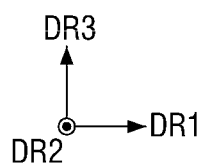

Referring to FIG. 19, the lower electrode 130 may be formed on the interface film 140 to completely or partially fill the inside of the lower electrode hole H.

Figure 20:
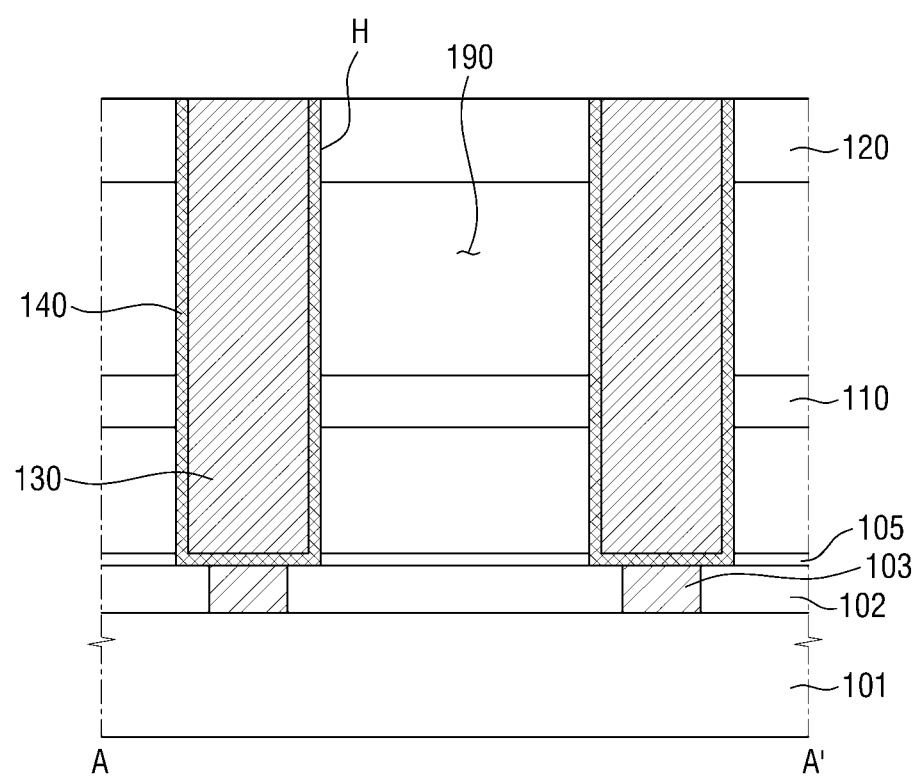
Figure 20:
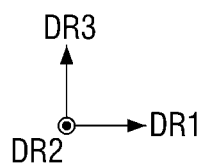

Referring to FIG. 20, the first mold film 181 and the second mold film 182 may be removed. Each of the first mold film 181 and the second mold film 182 may be removed, for example, through a wet etching process.

Figure 21:
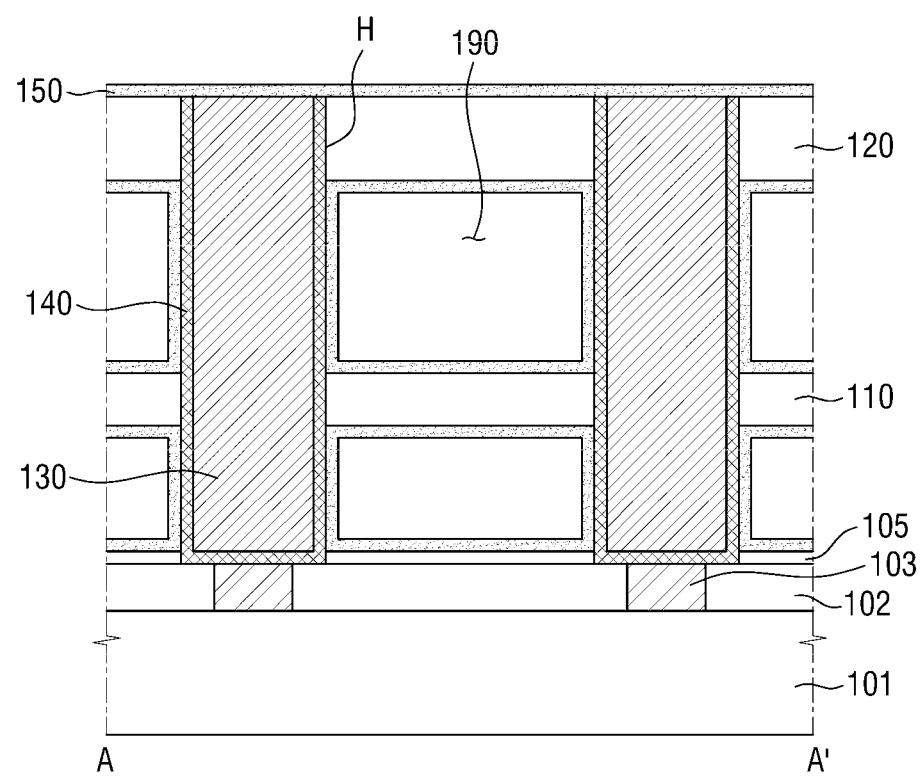
Figure 21:
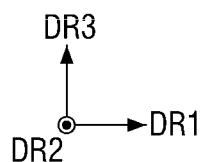

Referring to FIG. 21, a capacitor dielectric film 150 may be formed in a mold film removal region 190 from which the first mold film 181 and the second mold film 182 are removed.

The capacitor dielectric film 150 may be formed on the upper surface of the etching stop film 105, the upper surface and the lower surface of the first supporter pattern 110, the lower surface of the second supporter pattern 120, and the side walls of the interface film 140 in the mold film removal region 190 in a conformal manner. Further, the capacitor dielectric film 150 may be formed on the upper surface of the second supporter pattern 120, the uppermost surface of the lower electrode 130, and the uppermost surface of the interface film 140 in a conformal manner.

Subsequently, an upper electrode (160 of FIG. 2) may be formed on the capacitor dielectric film 150 in the mold film removal region 190. Further, the upper electrode (160 of FIG. 2) may be formed on the capacitor dielectric film 150 formed on the upper surface of the second supporter pattern 120. The semiconductor device shown in FIG. 2 may be fabricated through the above-described fabricating process in accordance with some embodiments of the inventive concept.

Hereinafter, a method of fabricating the semiconductor device shown in FIG. 9, according to some embodiments of the inventive concept, will be described referring to FIGS. 9 and 22 to 24.

Figure 22:
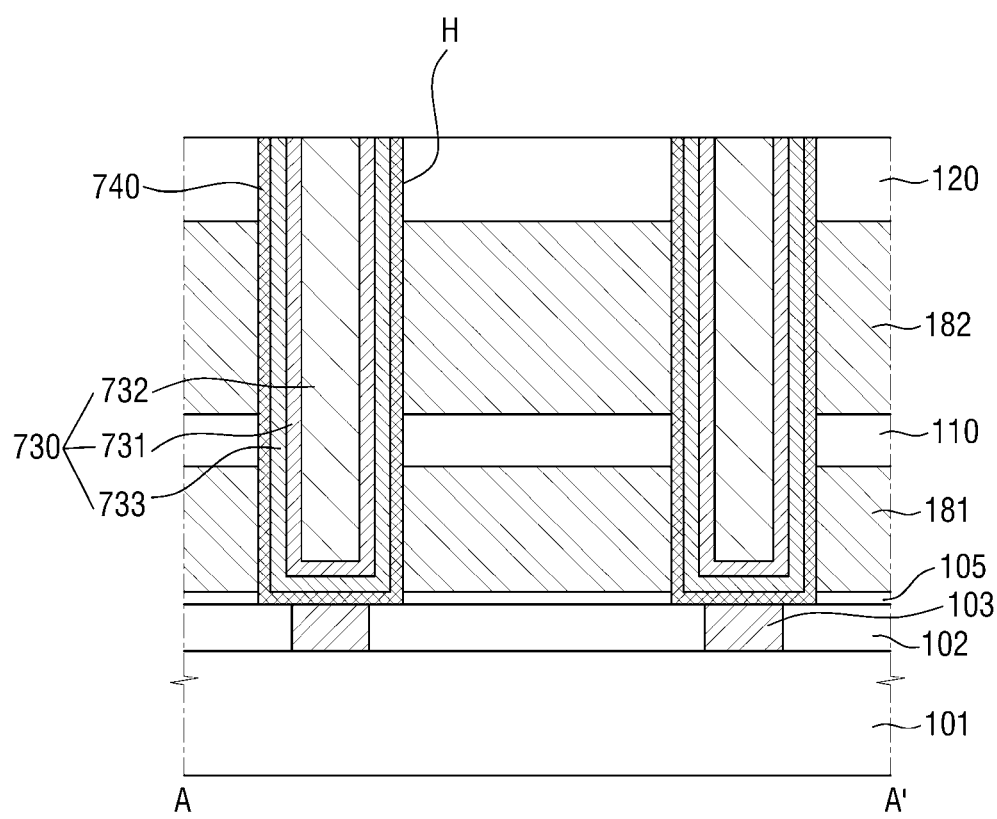
FIGS. 22 to 24 are intermediate stage diagrams that illustrate a method for fabricating the semiconductor device shown in FIG. 9.
Figure 22:
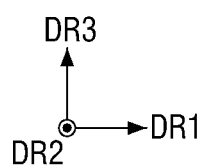
Figure 23:
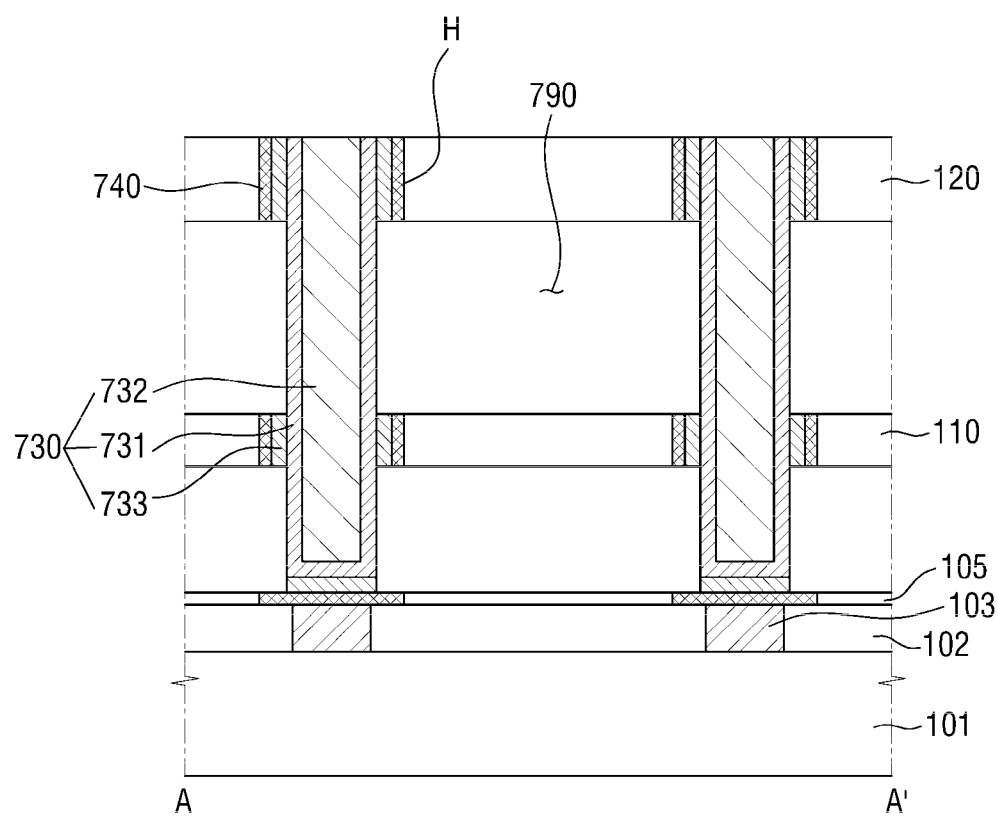
Figure 23:
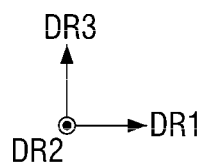
Figure 24:
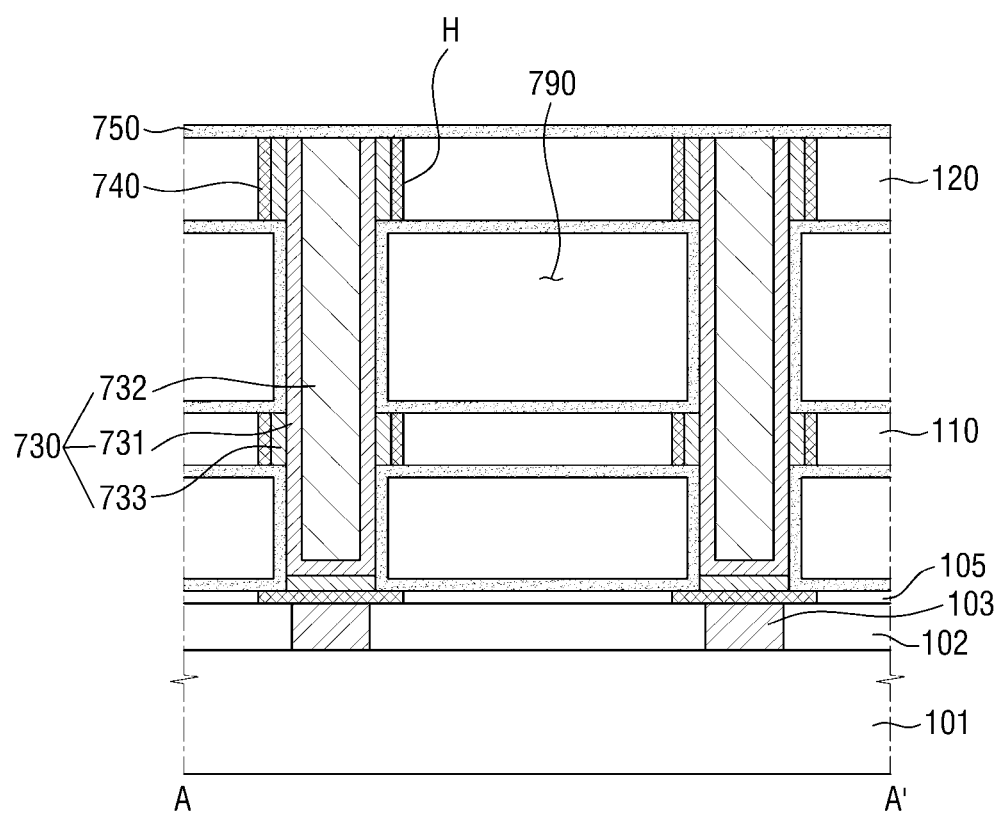
Figure 24:
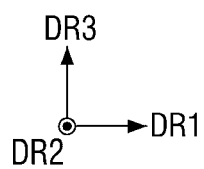

FIGS. 22 to 24 are intermediate stage diagrams that illustrate a method for fabricating the semiconductor device shown in FIG. 9 according to some embodiments of the inventive concept.

Referring to FIG. 22, after the fabricating process shown in FIGS. 12 to 18 is performed, a third lower electrode 733, a first lower electrode 731 and a second lower electrode 732 may be formed sequentially inside the lower electrode hole H.

Specifically, the third lower electrode 733 may be formed on the interface film 140 inside the lower electrode hole H in a conformal manner. Subsequently, the first lower electrode 731 may be formed on the third lower electrode 733 inside the lower electrode hole H in a conformal manner. Subsequently, the second lower electrode 732 may be formed on the first lower electrode 731 to completely or partially fill the inside of the lower electrode hole H.

Referring to FIG. 23, the first mold film 181 and the second mold film 182 shown in FIG. 22 may be removed, for example, through a wet etching process. In this case, the interface film 140 and the third lower electrode 733 existing between the etching stop film 105 and the first supporter pattern 110 may be removed. As a result, the first lower electrode 731 may be at least partially exposed or revealed through the mold film removal region 790 between the etching stop film 105 and the first supporter pattern 110.

Also, the interface film 140 and the third lower electrode 733 existing between the first supporter pattern 110 and the second supporter pattern 120 may be removed. Therefore, the first lower electrode 731 may be at least partially exposed or revealed through the mold film removal region 790 between the first supporter pattern 110 and the second supporter pattern 120.

Referring to FIG. 24, a capacitor dielectric film 750 may be formed in the mold film removal region 790.

The capacitor dielectric film 750 may be formed on the upper surface of the etching stop film 105, the upper surface and the lower surface of the first supporter pattern 110, the lower surface of the second supporter pattern 120, and the side walls of the first lower electrode 731 in the mold film removal region 790 in a conformal manner. Also, the capacitor dielectric film 750 may be formed on the upper surface of the second supporter pattern 120, the uppermost surface of the lower electrode 730, and the uppermost surface of the interface film 740 in a conformal manner.

Subsequently, an upper electrode (upper electrode 760 of FIG. 9) may be formed on the capacitor dielectric film 750 in the mold film removal region 790. Further, the upper electrode (upper electrode 760 of FIG. 9) may be formed on the capacitor dielectric film 750 formed on the upper surface of the second supporter pattern 120. The semiconductor device shown in FIG. 9 may be fabricated through the above-described fabricating process in accordance with some embodiments of the inventive concept.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate;
   first and second supporter patterns stacked sequentially on the substrate in a first direction and spaced apart from an upper surface of the substrate;
   a lower electrode hole that extends through the first and second supporter patterns on the substrate in the first direction;
   an interface film on side walls and a bottom surface of the lower electrode hole;
   a lower electrode inside the lower electrode hole on the interface film; and
   a capacitor dielectric film that is in physical contact with side walls of the interface film, an uppermost surface of the interface film, and an uppermost surface of the lower electrode,
   wherein the uppermost surface of the interface film is formed on a same plane as an upper surface of the second supporter pattern.

2. The semiconductor device of claim 1, wherein the interface film is between the first supporter pattern and the lower electrode, and between the second supporter pattern and the lower electrode.

3. The semiconductor device of claim 1, further comprising:
   an upper electrode, which is between the substrate and the first supporter pattern, between the first supporter pattern and the second supporter pattern, and on the upper surface of the second supporter pattern.

4. The semiconductor device of claim 3, further comprising:
   an upper interface film between the capacitor dielectric film and the upper electrode.

5. The semiconductor device of claim 1, wherein the capacitor dielectric film comprises:
   a first capacitor dielectric film in physical contact with the side walls of the interface film, and
   a second capacitor dielectric film on the first capacitor dielectric film and including a material different from the first capacitor dielectric film.

6. The semiconductor device of claim 1, wherein the lower electrode comprises
   a first lower electrode on the interface film in the lower electrode hole, and a second lower electrode in the inside of the lower electrode hole on the first lower electrode and including a second material different from a first material of the first lower electrode.

7. The semiconductor device of claim 6, wherein an uppermost surface of the first lower electrode is formed on the same plane as the uppermost surface of the interface film.

8. The semiconductor device of claim 6, wherein an uppermost surface of the first lower electrode is in physical contact with the second lower electrode.

9. The semiconductor device of claim 6, wherein the lower electrode further comprises a third lower electrode, which is between the interface film and the first lower electrode and includes a third material different from the first material of the first lower electrode,
an uppermost surface of the third lower electrode being formed on the same plane as the uppermost surface of the interface film.

10. The semiconductor device of claim 9, wherein at least a part of the capacitor dielectric film is in physical contact with side walls of the first lower electrode.

11. The semiconductor device of claim 9, wherein the second material of the second lower electrode is a same as the third material of the third lower electrode.

12. The semiconductor device of claim 1, wherein a thickness of the interface film is about 10 Å to 50 Å.

13. A semiconductor device comprising:
a substrate;
a lower electrode hole extending in a first direction perpendicular to an upper surface of the substrate on the substrate;
an interface film on side walls and a bottom surface of the lower electrode hole;
a first lower electrode on the interface film in the lower electrode hole;
a second lower electrode inside of the lower electrode hole on the first lower electrode and including a second material different from a first material of the first lower electrode; and
a capacitor dielectric film in physical contact with the side walls of the interface film, an uppermost surface of the interface film, and an uppermost surface of the second lower electrode.

14. The semiconductor device of claim 13, wherein the uppermost surface of the interface film is formed on a same plane as the uppermost surface of the second lower electrode.

15. The semiconductor device of claim 13, wherein an uppermost surface of the first lower electrode is formed on the same plane as the uppermost surface of the interface film.

16. The semiconductor device of claim 13, wherein the lower electrode further comprises a third lower electrode, which is between the interface film and the first lower electrode and includes a third material different from the first material of the first lower electrode,
an uppermost surface of the third lower electrode being formed on the same plane as the uppermost surface of the interface film.

17. The semiconductor device of claim 16, further comprising:
first and second supporter patterns stacked sequentially on the substrate and spaced apart from each other in the first direction,
wherein the interface film overlaps the capacitor dielectric film in the first direction between the first supporter pattern and the second supporter pattern.

18. The semiconductor device of claim 16, wherein the second material of the second lower electrode is a same as the third material of the third lower electrode.

19. A semiconductor device comprising:
a substrate;
first and second supporter patterns sequentially stacked on the substrate in a first direction and spaced apart from an upper surface of the substrate;
a lower electrode hole that extends through the first and second supporter patterns on the substrate in the first direction;
an interface film on side walls and a bottom surface of the lower electrode hole;
a lower electrode inside of the lower electrode hole on the interface film;
an upper electrode between the substrate and the first supporter pattern, between the first supporter pattern and the second supporter pattern, and on an upper surface of the second supporter pattern; and
a capacitor dielectric film between the substrate and the upper electrode, between the first supporter pattern and the upper electrode, between the second supporter pattern and the upper electrode, and between the interface film and the upper electrode,
wherein the capacitor dielectric film is in physical contact with sidewalls of the interface film, an uppermost surface of the interface film, and an uppermost surface of the lower electrode,
wherein the uppermost surface of the interface film is formed on a same plane as the upper surface of the second supporter pattern, and
wherein the interface film includes a metal oxide, a metal nitride, or a metal oxynitride.

20. The semiconductor device of claim 19, wherein the lower electrode comprises
a first lower electrode on the interface film in the lower electrode hole, and
a second lower electrode inside of the lower electrode hole on the first lower electrode and including a material different from the first lower electrode.

* * * * *